US006790678B2

(12) United States Patent
Song et al.

(10) Patent No.: US 6,790,678 B2
(45) Date of Patent: Sep. 14, 2004

(54) METHOD FOR FORMING CAPACITOR OF FERROELECTRIC RANDOM ACCESS MEMORY

(75) Inventors: Seo Young Song, Daejeon (KR); Sang Ick Lee, Gyeonggi-do (KR)

(73) Assignee: Hynix Semiconductor Inc., Kyoungki-Do (KR)

(*) Notice: Subject to any disclaimer, the term of this patent is extended or adjusted under 35 U.S.C. 154(b) by 0 days.

(21) Appl. No.: 10/610,406

(22) Filed: Jun. 30, 2003

(65) Prior Publication Data

US 2004/0137646 A1 Jul. 15, 2004

(30) Foreign Application Priority Data

Dec. 30, 2002 (KR) ................................. 10-2002-0086667

(51) Int. Cl.[7] ................................................ H01G 7/06
(52) U.S. Cl. ......................... 438/3; 438/240; 438/253; 438/692
(58) Field of Search ........................... 438/3, 238–256, 438/381–399, 690–693

(56) References Cited

U.S. PATENT DOCUMENTS 6,339,008 B1 * 1/2002 Takenaka ..................... 438/396
2003/0159362 A1 * 8/2003 Singh et al. ................... 51/293

* cited by examiner

*Primary Examiner*—H. Jey Tsai
(74) *Attorney, Agent, or Firm*—Marshall, Gerstein & Borun LLP

(57) ABSTRACT

Methods for forming capacitor of FeRAM are disclosed. The disclosed methods can prevent the step difference from an etch-back process and scratch on a Pt layer in a CMP process using a basic slurry by performing a CMP process using an acidic slurry including an organic acid when isolating a storage electrode in a formation process of a FeRAM capacitor.

19 Claims, 4 Drawing Sheets

METHOD FOR FORMING CAPACITOR OF FERROELECTRIC RANDOM ACCESS MEMORY

BACKGROUND OF THE INVENTION

1. Technical Field

Methods for forming capacitor of ferroelectric random access memory (hereinafter referred to as "FeRAM") are disclosed. The disclosed methods can prevent the step difference resulting from an etch-back process and scratch on a Pt layer in a CMP process using a basic slurry by performing a CMP process using an acidic slurry including an organic acid when a storage electrode is isolated in a formation process of a FeRAM capacitor.

2. Description of the Related Art

The FeRAM is one of the nonvolatile memory devices using polarization inversion and hysteresis characteristics of ferroelectric material. The FeRAM is an ideal memory that can store information in a powered-down state and has a high operating speed, large capacitance and low power consumption comparable to those of a DRAM.

The ferroelectric materials of FeRAM include $SrBi_2Ta_2O_9$ (hereinafter, referred to as "SBT"), $Sr_xBi_{2-y}(Ta_fNb_j)_2O_{9-z}$ (hereinafter, referred to as "SBTN"), $Pb(Zr_xTi_{1-x})O_3$ (hereinafter, referred to as "PZT"), $SrTiO_3$ (hereinafter, referred to as "ST") or $Bi_{4-x}La_xTi_3O_{12}$ (hereinafter, referred to as "BLT"). The ferroelectric material has high dielectric constant that ranges from a few hundreds to a few thousands at room temperature and has two stabilized remnant polarization states. Therefore, the above-described ferroelectric material can be formed into thin films and applied to nonvolatile memory devices.

The nonvolatile memory device incorporating the ferroelectric thin film may adjust directions of polarization by directions of an impressed electric field. The polarization induced by the electric field still remains although the electric field is eliminated. As a result, digital signals 1 and 0 may be stored depending on the directions of remnant polarization.

Since the ferroelectric material is a crystal, the lower materials disposed beneath the crystalline ferromagnetic thin film are important in growth of thin films. Platinum group metals or oxides thereof (hereinafter, referred to as "platinum group metal") such as Pt, Ir, Ru, $RuO_2$ or $IrO_2$ are generally used for ferroelectric electrodes materials. However, the platinum group metals do not easily react with other compounds because they are hard and stable refractory metals. As a result, it is difficult to etch the platinum group metals. In order to overcome this problem, a dry etching method is used to etch the platinum group metals by using species such as radicals, ions and electrons in plasma formed using an inert gas such as Ar or He with the reactive gas.

To form a storage electrode, a bottom electrode, in a FeRAM, an electrode is formed of a platinum group metal, Pt, and an insulating film such as SiO2 is deposited thereon. Then, an oxide etch back process is performed to isolate the storage electrode.

When an oxide etch back process is performed until the Pt layer (the storage electrode) is exposed, it is possible to isolate the storage electrode but difficult to etch the Pt layer. As a result, the oxide is polished more than the Pt layer, thereby generating a step difference. In this case, a ferroelectric material is not uniformly deposited in a subsequent process, and characteristics of ferroelectric material are not properly embodied.

When step difference is heavy, a ferroelectric material is deposited on a glue layer, thereby increasing leakage current. Additionally, uniformity of the ferroelectric material is degraded due to the step difference, thereby generating cracks in a subsequent annealing process.

In order to solve the problem of the etch back process for isolating a storage electrode, a CMP process is performed on the insulating film and the Pt layer using a basic slurry. However, although the problem of step difference generated in the etch back process is solved by performing a CMP process using a basic slurry, the surface of Pt layer is severely scratched as shown in FIG. 2.

SUMMARY OF THE DISCLOSURE

Methods for forming capacitor of FeRAM are disclosed where a storage electrode can be isolated without generation of step difference between a storage electrode and an insulating film as well as without generation of scratch on a Pt layer which is a storage electrode material.

DETAILED DESCRIPTION OF THE PRESENTLY PREFERRED EMBODIMENTS

Methods for forming capacitor of FeRAM are disclosed where a storage electrode is isolated by performing a CMP process using an acidic slurry including an organic acid having a higher polishing selectivity ratio to an insulating film than that to a Pt layer.

A method for forming a capacitor of a FeRAM comprises:

forming a storage electrode contact plug connected to a semiconductor substrate through a lower insulating layer;

(b) forming a diffusion barrier film on the lower insulating layer including the storage electrode contact plug;

(c) forming a conductive Pt layer for a storage electrode on the diffusion barrier film;

(d) forming a storage electrode by patterning a stacked structure of the diffusion barrier film and the Pt layer via a photolithography process;

(e) forming an insulating film on the resultant surface; and (f) isolating the storage electrode by performing a CMP process on the insulating film using an acidic CMP slurry including an organic acid until the Pt layer, a storage electrode, is exposed.

It is preferable that the acidic CMP slurry including the organic acid is a solution having a pH ranging from 2 to 6, the solution comprising distilled water; an abrasive selected from the group consisting of $SiO_2$, $Al_2O_3$ and $CeO_2$ diffused in the distilled water in an amount ranging from 10 to 30 wt % based on the CMP slurry; and the organic acid present in an amount ranging from 0.01 to 10 wt % based on the CMP slurry.

The organic acid is selected from the group consisting of citric acid, acetic acid, ammonium oxalate, tartaric acid and combinations thereof.

It is more preferable that the acidic CMP slurry is a solution having a pH ranging from 3 to 5, the solution including an organic acid in an amount ranging from 0.1 to 5 wt % based on the CMP slurry.

The acidic CMP slurry has a polishing selectivity ratio of the insulating film to the Pt layer in the following range: 100~600:1, preferably 150~300:1.

Thus, the insulating film is more rapidly polished than the Pt layer.

The disclosed method will be described in detail with reference to the accompanying drawings.

Figure 1A:
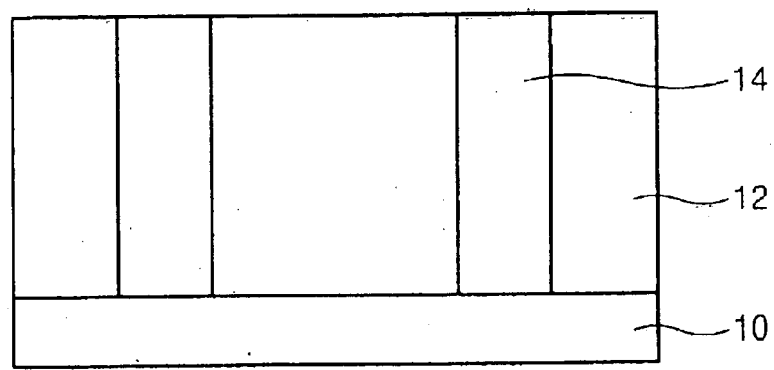
FIGS. 1a through 1d schematically, illustrate disclosed methods for forming a capacitor of a FeRAM in accordance with this disclosure.

Referring to FIG. 1a, a lower insulating layer 12 is formed on a semiconductor substrate 10 in the step (a). Then, a storage electrode contact plug 14 connected to the semiconductor substrate is formed by selectively etching the resultant surface.

Here, the storage electrode contact plug 14 is preferably a TiN plug or a W plug.

The storage electrode contact plug 14 is formed by a CMP process. The CMP slurry used in this CMP process is preferably an acidic slurry of pH in the range of 1~5 including an abrasive such as $SiO_2$ or $Al_2O_3$. Here, an oxidizer such as $H_2O_2$, $Fe(NO_3)_3$ or $H_5IO_6$ can be added to improve CMP characteristics.

Figure 1B:
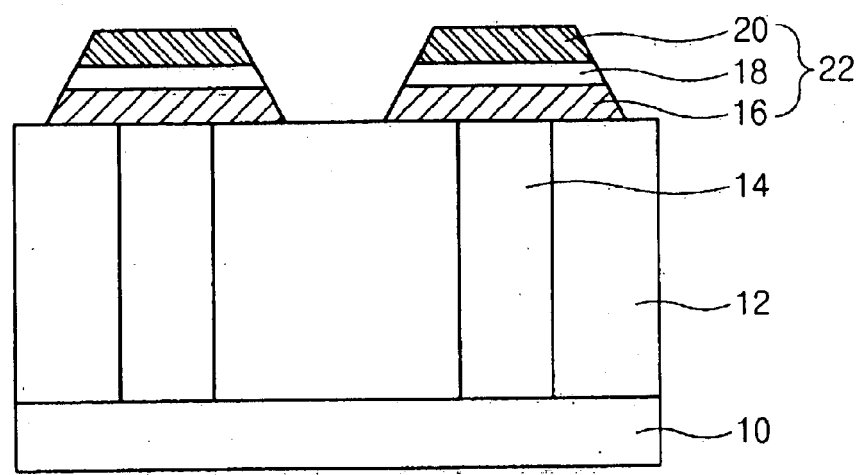

Referring to FIG. 1b, a diffusion barrier film is formed on the lower insulating layer including the storage electrode contact plug 14 in the steps (b)~(d).

It is preferable that the diffusion barrier film of the step (b) has a stacked structure of (1) a first diffusion barrier film 16 which is an oxygen diffusion barrier film and (2) a second diffusion barrier film 18 which is an inter-diffusion barrier between the oxygen diffusion barrier film and the storage electrode.

Preferably, the first diffusion barrier film 16 is formed by depositing materials selected from the group consisting of Ir, Rh, Ru and Pd at a thickness ranging from 500 to 2000 Å, and the second diffusion barrier film 18 is formed by depositing $IrO_2$ at a thickness ranging from 50 to 100 Å.

Thereafter, a Pt layer 20, which is a storage electrode material, is formed on the second diffusion barrier film 18 by depositing at a thickness ranging from 500 to 3000 Å.

Then, a storage electrode 22 having a stacked structure of the first diffusion barrier film 16, the second diffusion barrier film 18 and the Pt layer 20 is formed by selectively etching the resultant surface.

Figure 1C:
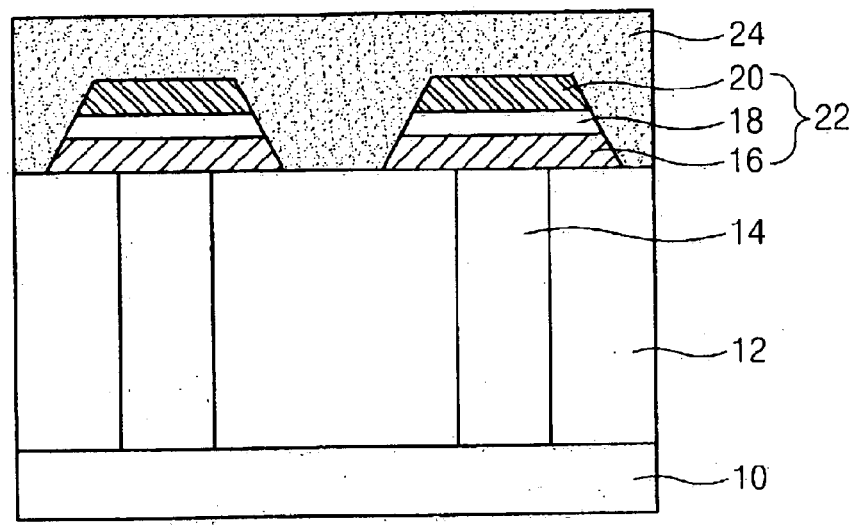

Referring to FIG. 1c, an insulating film 24 is formed on the resultant surface including the storage electrode 22 in the part (e).

The insulating film 24 is preferably $SiO_2$.

Figure 1D:
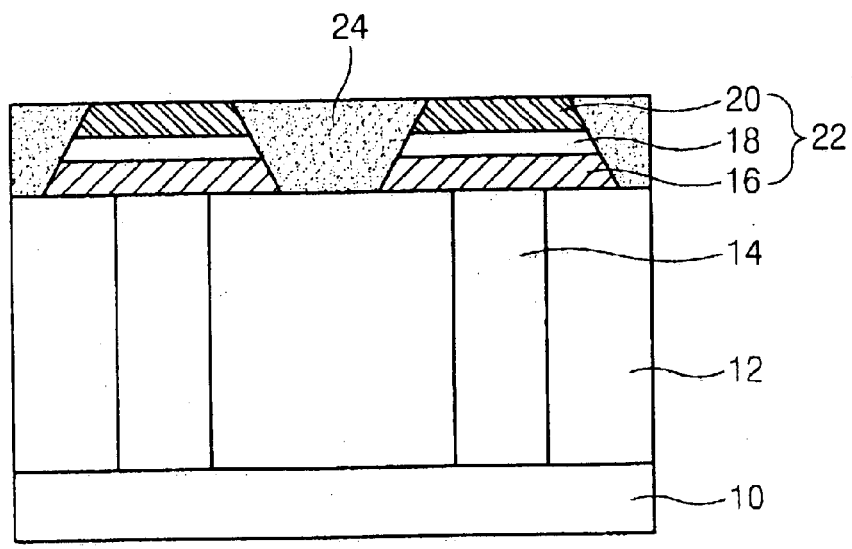
Figure 2:
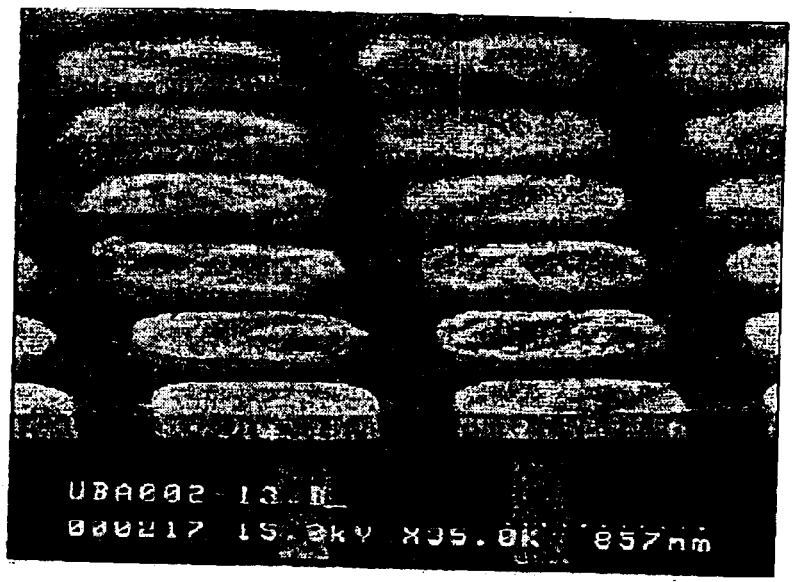
FIG. 2 is a SEM photograph illustrating a result of isolating a storage electrode using an alkali CMP slurry.

Referring to FIG. 1d, the insulating film 24 is polished using the acidic CMP slurry of the present invention until the Pt layer 20 is exposed in the part (f).

Figure 3:
FIG. 3 is a SEM photograph illustrating a result of isolating a storage electrode using the disclosed acidic CMP slurry.

As described above, the CMP slurry of the present invention has a higher polishing selectivity ratio to an insulating film than that to a Pt layer when compared to a conventional CMP slurry not containing the organic acid. Moreover, a scratch phenomenon is not generated on a Pt layer (see FIG. 3).

The disclosed method for forming a capacitor of a FeRAM will be described in more detail by referring to examples below, which are not intended to be limiting.

The polishing speed were measured when a $SiO_2$ layer and a Pt layer were polished using the disclosed acidic CMP slurry including an organic acid.

A HDP (High-Density Plasma) oxide layer was deposited on 8" wafer at a thickness of 7000 Å. A PVD (Physical Vapor Deposition) Pt layer was deposited on another 8" wafer at a thickness of 3000 Å.

Additionally, an acidic CMP slurry was prepared by adding an organic acid to Levasil 50CK-V1 CMP slurry of Bayer Co. with reference to Table 1.

The oxide film and the Pt layer were polished by flowing the CMP slurry prepared above at a flow rate of 200 ml/min into Strasbaugh CMP equipment under a table revolution rate of 50 rpm and a polishing pressure of 4 psi. Then, each of the measured polishing speed was shown in Table 1.

TABLE 1

| | $SiO_2$ Con. (wt %) | Kinds of Organic Acid | Organic Acid Con. (wt %) | Slurry pH | Polishing speed (Å/min) $SiO_2$ | Polishing speed (Å/min) Pt | Polishing Selectivity ($SiO_2$/Pt) |
|---|---|---|---|---|---|---|---|
| Example 1 | 30 | citric acid | 1 | 3.2 | 2900 | 9 | 322 |
| Example 2 | 30 | citric acid | 0.5 | 3.5 | 3100 | 10 | 310 |
| Example 3 | 30 | citric acid | 5 | 3.0 | 2850 | 8 | 356 |
| Example 4 | 30 | citric acid | 10 | 2.9 | 2500 | 7 | 357 |
| Example 5 | 20 | citric acid | 0.1 | 3.5 | 2050 | 12 | 171 |
| Example 6 | 10 | citric acid | 1 | 3.2 | 1500 | 8 | 188 |
| Example 7 | 30 | citric acid | 4 | 3.1 | 2900 | 5 | 580 |
| Example 8 | 30 | tartaric acid | 2 | 3.2 | 2850 | 8 | 356 |
| Example 9 | 30 | ammonium oxalate | 2 | 4.5 | 3250 | 6 | 542 |
| Example 10 | 30 | acetic acid | 2 | 3.0 | 2600 | 9 | 289 |
| Example 11 | 30 | tartaric acid | 1 | 3.4 | 3000 | 10 | 300 |
| Comparative Example 1 | 30 | — | — | 3.0 | 3200 | 50 | 34 |

The above results show that the disclosed acidic CMP slurry including an organic acid has a higher polishing selectivity ratio to an oxide film than that to a Pt layer. As a result, it is understood that a polishing effect of the interlayer insulating film to the Pt layer is improved.

As discussed earlier, when a lower electrode is formed in a FeRAM, a lower electrode is formed of a Pt layer, and an interlayer insulating film is deposited thereon. Then, when the lower electrode is isolated, a CMP process is performed using an acidic slurry including an organic acid until the Pt layer is exposed. As a result, step difference between the Pt layer and an adjacent interlayer insulating film can be minimized, and scratch of the Pt layer can also be reduced.

What is claimed is:

1. A method for forming a capacitor of a FeRAM, comprises:

(a) forming a storage electrode contact plug connected to a semiconductor substrate through a lower insulating layer;

(b) forming a diffusion barrier film on the lower insulating layer including the storage electrode contact plug;

(c) forming a conductive Pt layer for a storage electrode on the diffusion barrier film;

(d) forming a storage electrode by patterning a stacked structure of the diffusion barrier film and the Pt layer via a photolithography process;

(e) forming an insulating film covering the storage electrode and lower insulating layer; and (f) isolating the storage electrode by performing a CMP process on the insulating film using an acidic CMP slurry until the Pt layer is exposed, wherein acidic CMP slurry has a pH ranging from 2 to 6, the CMP slurry comprises:

distilled water;

an abrasive selected from the group consisting of $SiO_2$, $Al_2O_3$ and $CeO_2$ mixed with the distilled water to form a mixture present in an amount ranging from 10 to 30 wt % of the CMP slurry; and an organic acid present in an amount ranting from 0.5 to 10 wt % of the CMP slurry.

2. The method according to claim 1, wherein the organic acid is selected from the group consisting of citric acid, acetic acid, ammonium oxalate, tartaric acid and combinations thereof.

3. The method according to claim 1, wherein the acidic CMP slurry is a solution having a pH ranging from 3 to 5, and the organic acid is present in an amount ranging from 0.1 to 5 wt % based on the CMP slurry.

4. The method according to claim 1, wherein the acidic CMP slurry has polishing selectivity ratio of an insulating film to a Pt layer in the range of 100:

1~600:1.

5. The method according to claim 4, wherein the acidic CMP slurry has polishing selectivity ratio of an insulating film to a Pt layer in the range of 150:

1~300:1.

6. The method according to claim 1, wherein the storage electrode contact plug of the part (a) is a TiN plug or a W plug.

7. The method according to claim 1, wherein the diffusion barrier film of the part (b) comprises a stacked structure of a first diffusion barrier film which is an oxygen diffusion barrier film and a second diffusion barrier film which is an inter-diffusion barrier between the oxygen diffusion barrier film and the storage electrode.

8. The method according to claim 7, wherein the first diffusion barrier film is formed by depositing materials selected from the group consisting of Ir, Rh, Ru and Pd at a thickness ranging from 500 to 2000 Å.

9. The method according to claim 7, wherein the second diffusion barrier film is formed by depositing $IrO_2$ at a thickness ranging from 50 to 100 Å.

10. The method according to claim 1, wherein the Pt layer of the part (c) is deposited at a thickness ranging from 500 to 3000 Å.

11. A method for forming a capacitor of a FeRAM, comprises:

(a) forming a storage electrode contact plug connected to a semiconductor substrate through a lower insulating layer;

(b) forming a diffusion barrier film on the lower insulating layer including the storage electrode contact plug;

(c) forming a conductive layer consisting essentially of Pt on the diffusion barrier film;

(d) forming a storage electrode by patterning a stacked structure of the diffusion barrier film and the conductive layer via a photolithography process;

(e) forming an insulating film on the storage electrode and lower insulating layer; and (f) isolating the storage electrode by performing a CMP process on the insulating film using an acidic CMP slurry of pH ranging from 2 to 6 including an organic acid of 0.5 to 10 wt % based on the CMP slurry until the conductive layer is exposed.

12. The method according to claim 11, wherein the acidic CMP slurry comprising:

a distilled water;

an abrasive selected from the group consisting of $SiO_2$, $Al_2O_3$ and $CeO_2$ diffused in the distilled water in an amount ranging from 10 to 30 wt % based on the CMP slurry; and an organic acid present in an amount ranging from 0.1 to 5 wt % based on the CMP slurry.

13. The method according to claim 12, wherein the organic acid is selected from the group consisting of citric acid, acetic acid, ammonium oxalate, tartaric acid and combinations thereof.

14. The method according to claim 11, wherein the acidic CMP slurry has pH ranging from 3 to 5.

15. The method according to claim 11, wherein the acidic CMP slurry has polishing selectivity ratio of an insulating film to a Pt layer in the range of 100:1~600:1.

16. The method according to claim 14, wherein the acidic CMP slurry has polishing selectivity ratio of an insulating film to a Pt layer in the range of 150:1~300:1.

17. The method according to claim 11, wherein the diffusion barrier film of the part (b) comprises a stacked structure of a first diffusion barrier film which is an oxygen diffusion barrier film and a second diffusion barrier film which is an inter-diffusion barrier between the oxygen diffusion barrier film and the storage electrode.

18. The method according to claim 17, wherein the first diffusion barrier film is formed by depositing materials selected from the group consisting of Ir, Rh, Ru and Pd at a thickness ranging from 500 to 2000 Å and the second diffusion barrier film is formed by depositing $IrO_2$ at a thickness ranging from 50 to 100 Å.

19. The method according to claim 11, wherein the Pt layer of the part (c) is deposited at a thickness ranging from 500 to 3000 Å.

* * * * *

UNITED STATES PATENT AND TRADEMARK OFFICE
CERTIFICATE OF CORRECTION

PATENT NO. : 6,790,678 B2
DATED : September 14, 2004
INVENTOR(S) : Song et al.

It is certified that error appears in the above-identified patent and that said Letters Patent is hereby corrected as shown below:

Column 5,
Line 25, after "present in an amount" please delete "ranting" and insert -- ranging -- in its place.

Signed and Sealed this

Nineteenth Day of April, 2005

JON W. DUDAS
*Director of the United States Patent and Trademark Office*